United States Patent
Wu et al.

(10) Patent No.: US 6,239,027 B1
(45) Date of Patent: May 29, 2001

(54) METHOD USING A PHOTORESIST RESIDUE

(75) Inventors: Huang-Hui Wu, Changhua Hsien; Tz-Ian Hung, Tainan Hsien, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/256,566

(22) Filed: Feb. 24, 1999

(51) Int. Cl.$^7$ .............................................. H01L 21/8242

(52) U.S. Cl. ........................ 438/644; 438/584; 438/628; 438/648; 438/758; 438/761; 438/763; 438/791

(58) Field of Search ..................................... 438/584, 628, 438/644, 648, 758, 761, 763, 791

(56) References Cited

U.S. PATENT DOCUMENTS 5,693,554 * 12/1997 Lee .......................................... 437/52

* cited by examiner

*Primary Examiner*—Charles Bowers
*Assistant Examiner*—Lisa Kiloay
(74) *Attorney, Agent, or Firm*—Thomas, Kayden, Horstemeyer & Risley

(57) ABSTRACT

An improved method for photoresist residue is described. The method is used for preventing a material layer from being damaged by the photoresist residue. A semiconductor substrate is provided. An insulating layer is formed over the substrate. The patterned material layer is formed on the insulating layer. A thin dielectric layer is formed on the insulating layer and the material layer to protect the material layer. A patterned photoresist layer is formed on the dielectric layer. The insulating layer is defined. The photoresist layer is removed.

7 Claims, 2 Drawing Sheets

METHOD USING A PHOTORESIST RESIDUE

BACKGROUND OF THE INVENTION

1. Field of Invention

The present invention relates to an improved method for photoresist residue. More particularly, the present invention relates to an improved method for photoresist residue on a surface of a titanium nitride layer.

2. Description of Related Art

In semiconductor processes, a patterned method uses photoresist material to transfer patterns. Photoresist material is sensitive to light. Through exposure and development, a photoresist layer is formed to serve as an etching mask. With the photoresist layer serving as a mask, the underlayer is patterned.

Etching different material needs a suitable photoresist material serving as an etching mask. However, while etching titanium nitride, the photoresist material serving as a mask for etching the insulating layer causes damage to the titanium nitride. In a conventional method, a photoresist layer is directly formed on the titanium nitride. This causes a defect on the surface of the titanium nitride bottom electrode, and a portion of the photoresist material may remain on the surface of the bottom electrode.

A semiconductor process for a fingerprint sensor is taken as an example. After an interconnect is fabricated, a sensor region having an area of about 2.25 $cm^2$ which is like a finger is formed over a top surface of a semiconductor substrate. The layout of the sensor region has a capacitor with about 300 lines and about 300 rows. Titanium nitride is commonly used for a material for a bottom electrode of the capacitor. The fingers serve as an upper electrode of the capacitor. The capacitor in the fingerprint sensor is used to induce static electricity on a fingertip surface. The fingertip surface is composed of raised lines and depressions between the raised lines. The capacitance induced by the raised lines is different from that induced by the depressions, and this difference is read by the sensor. Finally, the signals are transformed into an image.

In fabrication of a conventional fingerprint sensor, after an interconnect is fabricated, a patterned titanium nitride layer is deposited to serve as a bottom electrode. Then an opening is formed in a silicon oxide layer between a pad and a titanium nitride layer to serve as a connection in a latter package process. While patterning the silicon oxide layer, a photoresist layer is formed on the silicon oxide layer and the titanium nitride layer. However, the titanium nitride layer is damaged by the photoresist material to cause a defect generated on a surface of the titanium nitride layer. Moreover, some photoresist residue remains on the surface of the titanium nitride layer. As a result, the quality of the capacitor is thus decreased.

SUMMARY OF THE INVENTION

The invention provides an improved method for photoresist residue. The method is used to prevent a material layer from being damaged by the photoresist residue. A semiconductor substrate is provided. An insulating layer is formed over the substrate. The patterned material layer is formed on the insulating layer. A thin dielectric layer is formed on the insulating layer and the material layer to protect the material layer. A patterned photoresist layer is formed on the dielectric layer. The insulating layer is defined. The photoresist layer is removed.

Additionally, the invention provides an improved method for fabricating a capacitor for a fingerprint sensor. The method is used after fabricating an interconnect. A semiconductor substrate is provided. A patterned first conductive layer is formed to serve as a pad. An insulating layer is formed on the first conductive layer. A second conductive layer is formed on the insulating layer. The second conductive layer is defined to form a bottom electrode of the subsequently formed capacitor. A first dielectric layer is formed on the bottom electrode and the insulating layer. A patterned photoresist layer is formed on the first dielectric layer. The first dielectric layer and the insulating layer are defined to form an opening until the first conductive layer is exposed. The photoresist layer is removed. A second dielectric layer is formed on the first dielectric layer wherein the first dielectric layer and the second dielectric layer form a dielectric film of the capacitor. The second dielectric layer is defined until the first conductive layer is exposed by the opening.

One advantage of the invention is the formation of a thin dielectric layer after the bottom electrode is formed. The thin dielectric layer serves as a part of a dielectric film of a capacitor, and, most importantly, it can protect the bottom electrode from contamination by photoresist residue in a later process.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
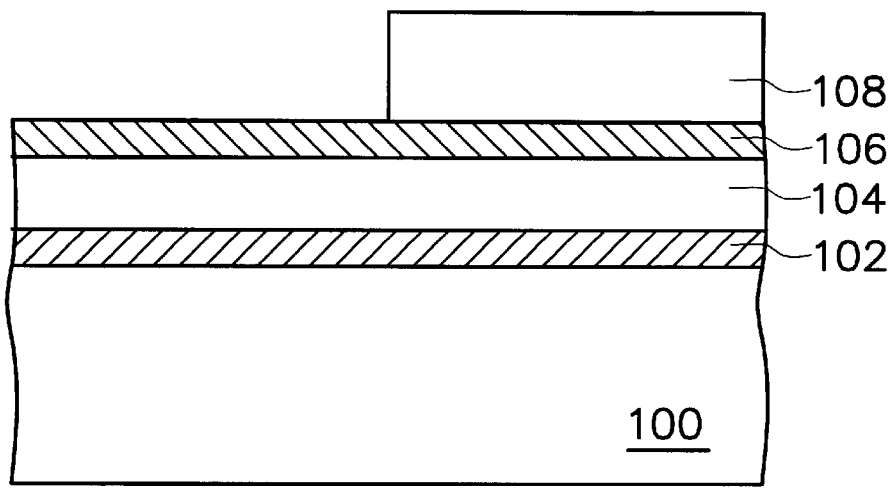
FIGS. 1A through 1E are schematic, cross-sectional views showing an improved method for photoresist residue in fabrication of a fingerprint sensor according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1E are schematic, cross-sectional views showing an improved method for photoresist residue in fabrication of a fingerprint sensor according to one preferred embodiment of this invention.

Referring to FIG. 1A, a substrate 100 such as a semiconductor silicate substrate is provided. The substrate 100 comprises a metal oxide semiconductor (MOS) transistor and an interconnect (not shown) formed thereon. A patterned conductive line 102 is formed on the substrate 100. The conductive layer 102 is the top conductive layer in the interconnect in order to serve as a pad. The conductive layer 102 includes, for example, aluminum, aluminum alloy, copper, copper alloy or other similar material. An insulating layer 104 such as silicon oxide is formed on the conductive layer 102. The insulating layer 104 is preferably from about 10,000 Å to about 14,000 Å thick. The conductive layer 102 is formed by, for example, chemical vapor deposition (CVD) with tetra-ethyl-ortho-silicate (TEOS) serving as a gas source. A via hole (not shown) is formed in the dielectric layer 104 in order to be connected with a bottom electrode of a subsequently formed capacitor. Another conductive layer 106 is formed on the dielectric layer 104 in order to serve as a bottom electrode of the subsequently formed capacitor. The conductive layer 106 is preferably from about 1,800 Å to about 2,200 Å thick. The conductive layer 106 is preferably made of silicon nitride. The conductive layer 106 further comprises filling the via hole (not shown) to be electrically connected with the conductive layer 102. In addition, the via hole can be filled with conductive material to form a via plug, and then the conductive layer 106 is formed to electrically couple the plug. A patterned photoresist layer 108 is formed on the conductive layer 102 to cover an area where a required capacitor is to be formed.

Figure 1B:
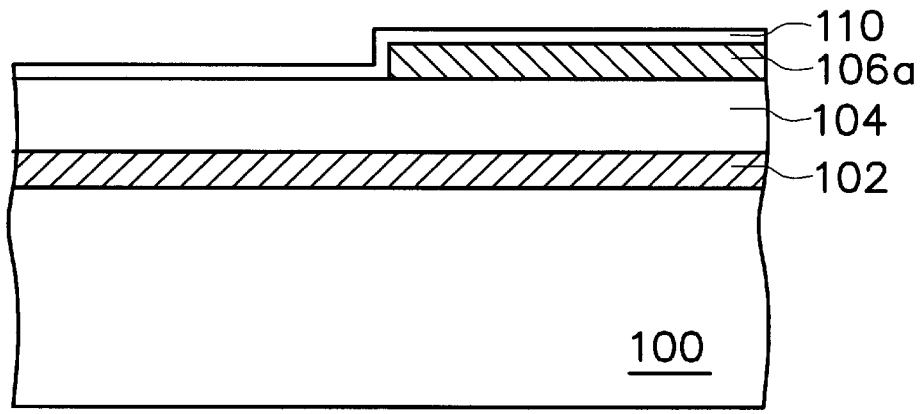

Referring to FIG. 1B, with the patterned photoresist layer 108 (FIG. 1A) serving as a mask, an isotropic etching process is performed to etch the conductive layer 106 until the insulating layer 104 is exposed. Thus, the conductive layer 106 forms a bottom electrode 106a of a subsequently formed capacitor. The photoresist layer 108 (FIG. 1A) is removed by, for example, a conventional removal method. A thin dielectric layer 110, which is somewhat conformal to the surface of the substrate 100, is formed on the bottom electrode 106a and on the insulating layer 104. The dielectric layer 110 serves as a part of a dielectric film of a capacitor. The thin dielectric layer 110 is preferably from about 80 Å to about 150 Å. The dielectric layer 110 includes, for example, silicon nitride, silicon oxide, or the similar material, and is preferably made of silicon nitride.

One advantage of the invention is the formation of the thin dielectric layer 110 on the bottom electrode 106a. The dielectric layer 110 serves as a part of a dielectric film of the subsequently formed capacitor, and, most importantly, the dielectric layer 110 can protect the bottom electrode 106a from being contaminated by photoresist residue in a later process.

Figure 1C:
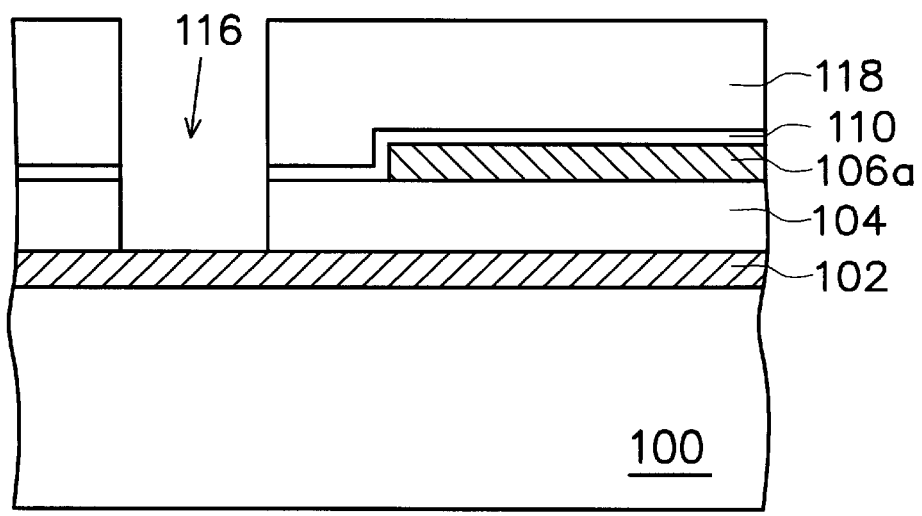

Referring to FIG. 1C, another patterned photoresist layer 118 is formed on the dielectric layer 110 to expose the region on which a connection is formed. With the photoresist layer 118 serving as a mask, the dielectric layer 110 and the insulating layer 104 are etched until the conductive layer 102 is exposed to form an opening 116.

Different materials need suitable photoresist materials to serve as an etching masks during etching. However, the photoresist material serving a mask for etching the insulating layer 104 causes damage to the titanium nitride bottom electrode 106a. In the conventional process, a photoresist layer is directly formed on the titanium nitride bottom electrode. This causes a defect on the surface of the titanium nitride bottom electrode, and a portion of the photoresist material may remain on the surface of the bottom electrode. In contrast, the invention first forms the thin dielectric layer 110 to cover the titanium nitride bottom electrode 106a before the photoresist layer 118 is formed to define the insulating layer 104.

Figure 1D:
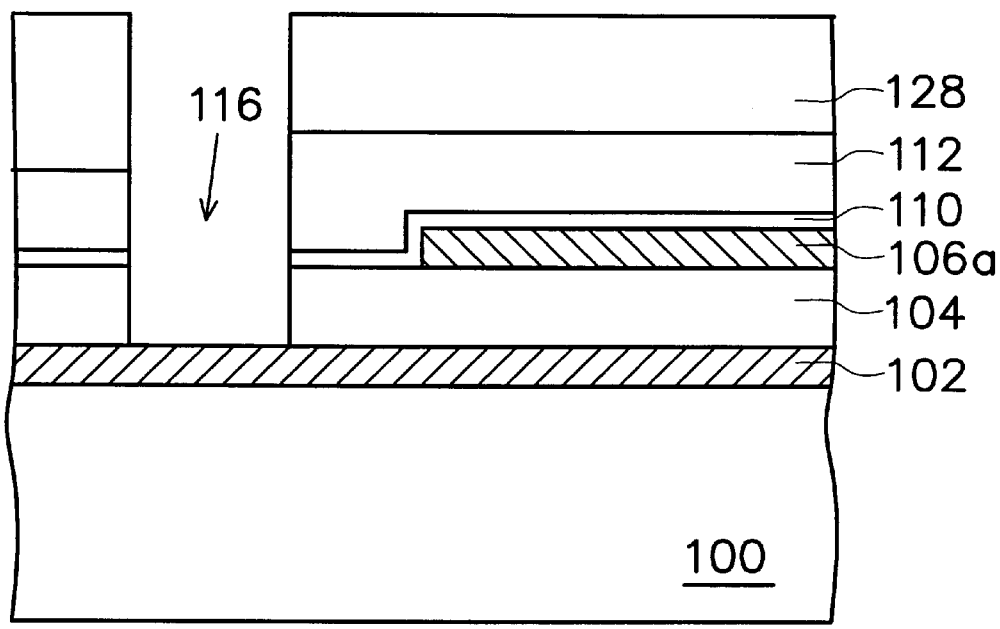

Referring to FIG. 1D the photoresist layer 118 (FIG. 1C) is removed by a conventional method. Another thicker dielectric layer 112 is formed on the dielectric layer 110 to fill the opening 116. The dielectric layer 112 is formed by, for example, chemical vapor deposition (CVD). The dielectric layer 112 is preferably from about 7,000 Å to about 6,800 Å thick. The dielectric layer 112 not only serves as a part of a dielectric film of the subsequently formed capacitor, but also serves as a passivation layer of a whole semiconductor circuit. Hence, in order to protect devices from physical damage, the dielectric layer 112 is preferably made of a material with a high density, large hardness, and a high dielectric constant. Moreover, the dielectric layer 112 prevents the whole semiconductor circuit from moisture or alkali metal ions penetrating through.

Still referring to FIG. 1D, a patterned photoresist layer 128 is formed on the dielectric layer 112. The photomask used for the photoresist layer 128 exposure is the same as the photomask used for the photoresist layer 118 exposure. With the photoresist layer 128 serving as an etching mask, the thicker dielectric layer 112 is etched until the conductive layer 102 is exposed.

Figure 1E:
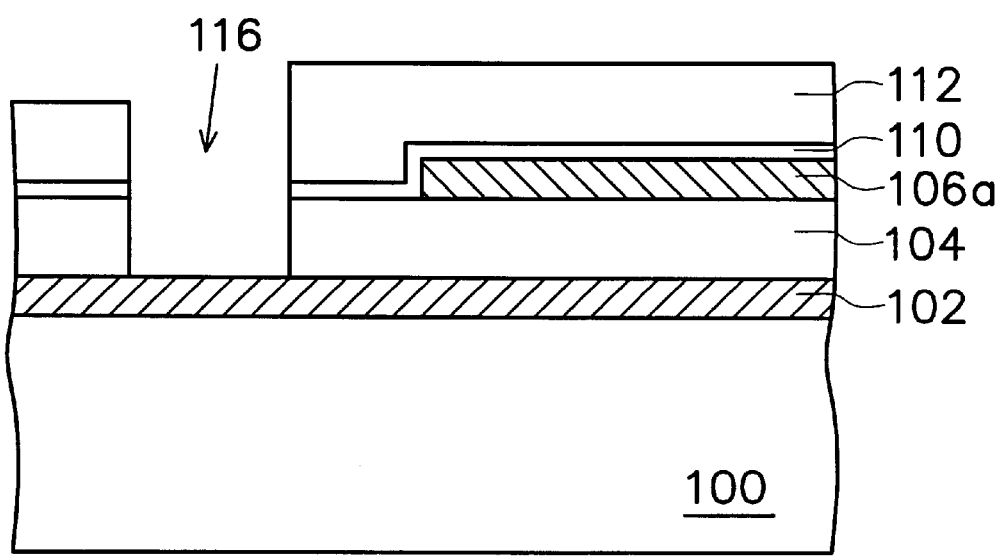

Referring to FIG. 1E, the photoresist layer 128 is removed by a conventional method. Then, processes for a package are performed. The processes for the package are not directly related to the invention, so detailed description is omitted here.

One advantage of the invention is the formation of a thin dielectric layer after the bottom electrode is formed. The thin dielectric layer serves as a part of a dielectric film of a capacitor, and, most importantly, it can protect the bottom electrode from being contaminated by photoresist residue in a later process.

In addition, if the exposed part of the titanium nitride layer is damaged by the photoresist residue during definition of the insulating layer in any semiconductor process, a thin dielectric layer can be formed on surface of the titanium nitride layer to prevent the titanium nitride layer from being directly damaged by photoresist residue.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An improved method for using a photoresist residue to prevent a material layer from being damaged by the photoresist residue, the method comprising:

providing a semiconductor substrate;

forming an insulating layer over the substrate;

forming a patterned material layer on the insulating layer;

forming a conformal dielectric layer upon the insulating layer and the patterned material layer;

forming a patterned photoresist layer upon a portion of the conformal dielectric layer, the conformal dielectric layer covering the patterned material layer;

removing a portion of the conformal dielectric layer and the insulating layer using the patterned photoresist as a mask; and removing the photoresist layer.

2. The method according to claim 1, wherein the insulating layer comprises silicon oxide.

3. The method according to claim 1, wherein the patterned material layer comprises titanium nitride.

4. The method according to claim 1, wherein the conformal dielectric layer comprises silicon nitride.

5. The method according to claim 1, wherein the conformal dielectric film is from about 80 angstroms to about 150 angstroms thick.

6. A method for forming a photoresist layer, the method comprising:

provulating a substrate;

forming an insulating layer over the substrate;

forming a patterned conductive layer upon the insulating layer;

forming a conformal dielectric layer upon the insulating layer and the patterned conductive layer; and forming a patterned photoresist layer upon the conformal dielectric layer, wherein the conformal dielectric layer protects the patterned conductive layer from the photoresist layer; and removing a portion of the conformal dielectric layer and the insulating layer using the patterned photoresist as a mask.

7. The method according to claim 6, wherein the conductive layer is made of titanium nitride.

* * * * *